(12) United States Patent
Ramsbey et al.

(10) Patent No.: US 6,573,151 B1
(45) Date of Patent: Jun. 3, 2003

(54) METHOD OF FORMING ZERO MARKS

(75) Inventors: Mark T. Ramsbey, Sunnyvale, CA (US); Terence C. Tong, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/884,204

(22) Filed: Jun. 19, 2001

Related U.S. Application Data

(60) Provisional application No. 60/227,121, filed on Aug. 22, 2000.

(51) Int. Cl.[7] .............................................. H01L 21/76
(52) U.S. Cl. ....................... 438/401; 438/197; 438/975; 257/797
(58) Field of Search ................................. 438/975, 401, 438/197; 257/797; 148/DIG. 102

(56) References Cited

U.S. PATENT DOCUMENTS

| | | | | |
|---|---|---|---|---|
| 4,244,752 A | * | 1/1981 | Henderson, Sr. et al. | |
| 4,487,653 A | * | 12/1984 | Hatcher | |
| 5,252,510 A | * | 10/1993 | Lee et al. | |
| 5,814,552 A | * | 9/1998 | Lu | |
| 5,950,093 A | * | 9/1999 | Wei | 438/401 |
| 6,127,737 A | * | 10/2000 | Kuroi et al. | 257/797 |
| 6,303,460 B1 | * | 10/2001 | Iwamatsu | 438/401 |
| 6,368,937 B1 | * | 4/2002 | Nakamura | 438/401 |
| 6,368,972 B1 | * | 4/2002 | Maury et al. | 438/692 |
| 6,391,700 B1 | * | 5/2002 | Tsay | |

\* cited by examiner

*Primary Examiner*—Long Pham
(74) *Attorney, Agent, or Firm*—Amin & Turocy, LLP

(57) ABSTRACT

A method for making a semiconductor structure, includes patterning a photoresist layer to form both a zero marks pattern and a well implant mask pattern. The photoresist layer is on a region of a substrate.

12 Claims, 2 Drawing Sheets

(a)

(b)

P/N Ion Implantation (c)

(d)

METHOD OF FORMING ZERO MARKS

This application claims the benefit of provisional application Ser. No. 60/227,121 filed Aug. 22, 2000.

BACKGROUND

The present invention relates to methods for the formation of zero marks on semiconductor devices.

Zero marks facilitate alignment of layers in semiconductor devices. They can be located on the periphery of the device or, alternatively, in every diode field. Typically, the zero marks are formed first and are carried along during further structure formation.

In FIGS. 1(a)–1(d) is shown a traditional approach to the formation of zero marks and isolation structures. First, an oxide layer 104 is formed on a silicon substrate 102. Then, a first photoresist 106 layer is spun on the surface of the oxide layer 104, resulting in the structure shown in FIG. 1(a).

Next, the first photoresist layer 106 is patterned to form a zero marks mask. Afterwards, an etch is performed through the exposed portions of the oxide layer 104 and into the silicon substrate 102 to form a set of zero marks 108, as shown in FIG. 1(b).

The first photoresist layer 106 is then stripped, and a second photoresist layer 110 is spun over the surface of the structure and patterned to form a deep well mask. Subsequently, an etch is performed to remove the exposed portions of the oxide layer 104 and form a photomasking "hole" 112 over the active region, illustrated in FIG. 1(c). Unlike the prior etch to form the zero marks 108, the silicon substrate 102 is not typically penetrated.

Ion implantation is then performed over the photomasking "hole" to form a deep P or N well 114, as shown in FIG. 1(d). Finally, the second photoresist layer 110 is stripped and the surface is cleaned, to form the structure shown in FIG. 1(e).

BRIEF SUMMARY

In one aspect, the present invention concerns a method for making a semiconductor structure, comprising patterning a photoresist layer to form both a zero marks pattern and a well implant mask pattern. The photoresist layer is on a region of a substrate.

In a second aspect, the present invention is a semiconductor structure, comprising a substrate and a photoresist layer on a region of the substrate. The photoresist layer has been patterned to form both a zero marks pattern and a deep well mask pattern.

Definitions

The term "substrate" refers to any semiconductor material conventionally known to those of ordinary skill in the art. Examples include silicon, gallium arsenide, germanium, gallium nitride, aluminum phosphide, and alloys such as $Si_{1-x}Ge_x$ and $Al_xGa_{1-x}As$, where $0 \leq x \leq 1$. Many others are known, such as those listed in Semiconductor Device Fundamentals, on page 4, Table 1.1 (Robert F. Pierret, Addison-Wesley, 1996). Preferably, the semiconductor substrate is silicon, which may be doped or undoped.

The term "oxide" refers to a metal oxide conventionally used to isolate electrically active structures in an integrated circuit from each other, typically an oxide of silicon and/or aluminum (e.g., $SiO_2$ or $Al_2O_3$, which may be conventionally doped with fluorine, boron, phosphorus or a mixture thereof, preferably $SiO_2$ or $SiO_2$ conventionally doped with 1–12 wt % of phosphorous and 0–8 wt % of boron).

The term "dielectric layer" refers to any dielectric material conventionally known to those of ordinary skill in the art. Examples include conventional oxides, nitrides, oxynitrides, and other dielectrics, such as borophosphosilicate glass (BPSG), borosilicate glass (BSG), phosphosilicate glass, spin-on glass (SOG), silicon oxide, P-doped silicon oxide (P-glass), and silicon nitride, for example $SiO_2$, $Si_3N_4$, $Al_2O_3$, $SiO_xN_y$, etc. When the dielectric layer is an oxide layer, it preferably has a thickness of 10 to 999 Å, more preferably a thickness of 100 to 300 Å.

BRIEF DESCRIPTION OF THE DRAWINGS

Various other objects, features and attendant advantages of the present invention will be more fully appreciated as the same becomes better understood from the following detailed description when considered in connection with the accompanying drawings in which like reference characters designate like or corresponding parts throughout the several views and wherein.

DETAILED DESCRIPTION

With the present invention it is possible to eliminate the separate zero-mask step, by forming the zero marks mask concurrently with the well implant mask. This reduces the total number of steps needed to form semiconductor devices.

Figure 1:
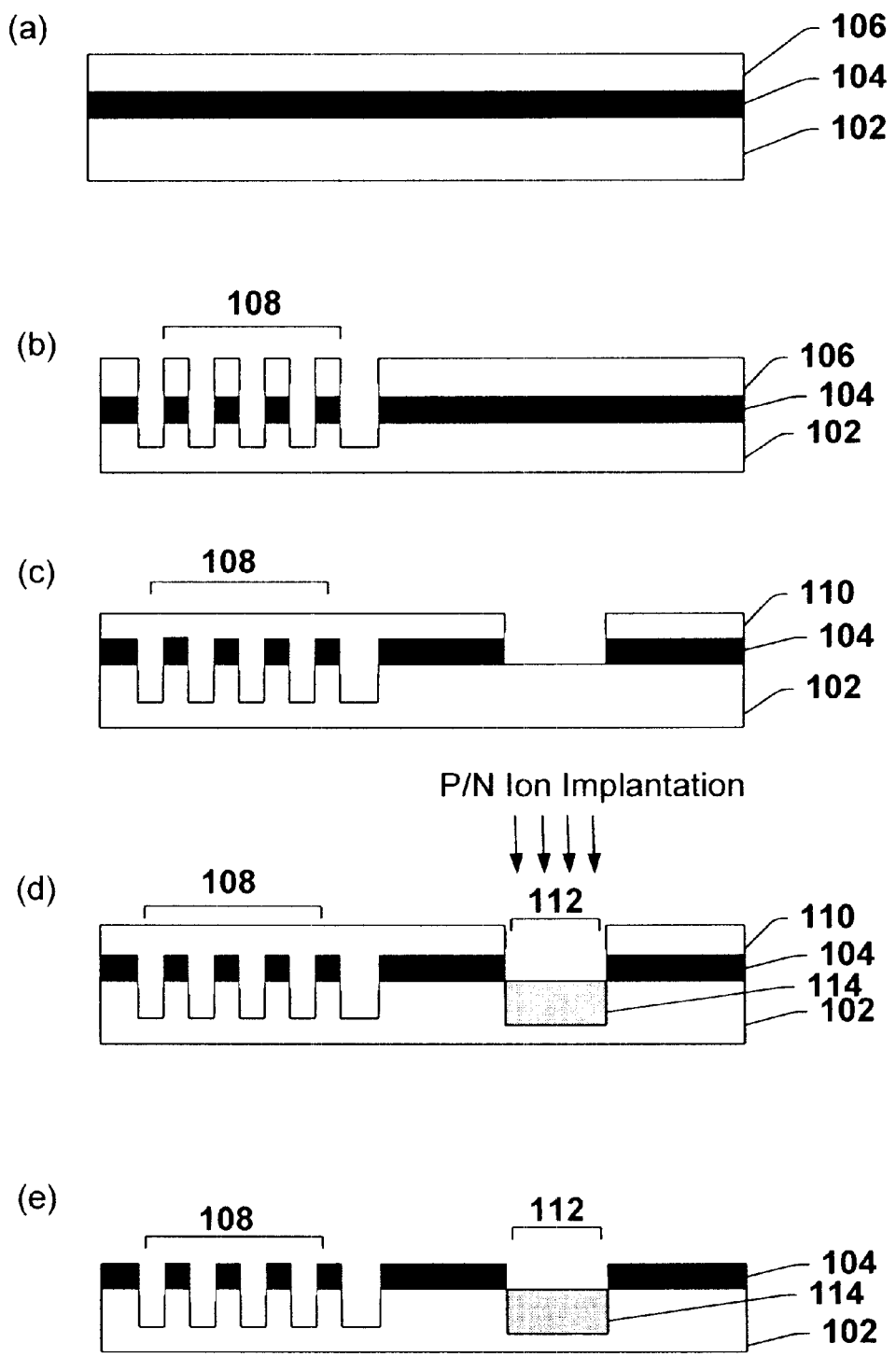
FIGS. 1(a)–1(e) illustrate a series of successive edge-on views for preparing a semiconductor structure with zero marks and a deep N or P well according to a conventional approach.

FIGS. 2(a)–2(d) illustrate a series of successive edge-on views for preparing a semiconductor structure similar to that shown in FIG. 1(e) according to the present invention. First, a dielectric layer 204 is formed on a substrate 202. Then, a photoresist layer 206 is applied on the surface of the dielectric layer 204, resulting in the structure shown in FIG. 1(a). Preferably, the substrate 202 is a single crystal silicon and the dielectric layer 204 is thermally grown oxide.

Figure 2:
FIGS. 2(a)–2(d) illustrate a series of successive edge-on views for preparing a semiconductor structure similar to that shown in FIG. 1(e) according to the present invention.
Figure 2:
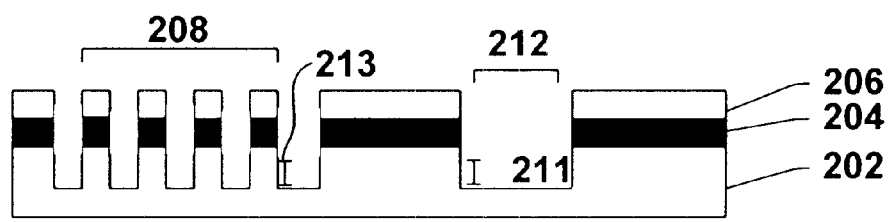
Figure 2:
Figure 2:
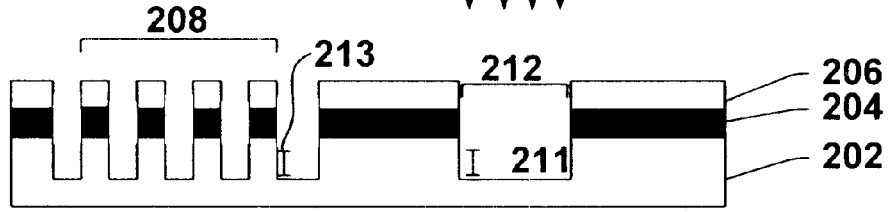
Figure 2:
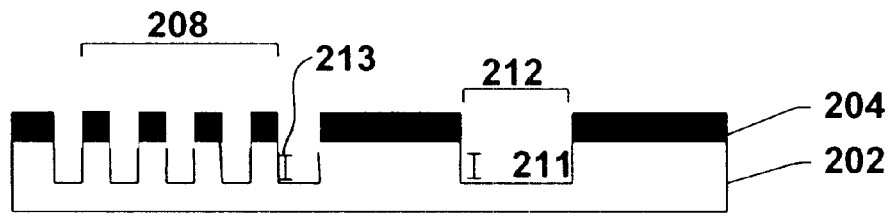

The photoresist layer 206 is then patterned to form both a zero marks mask and a deep well mask. Afterwards, an etch is performed through the exposed portions of the dielectric layer 204 and into the substrate 202 to form a set of zero marks 208, a photomasking "hole" 212, a zero marks recess 213, and a photomasking "hole" recess 211, as shown in FIG. 2(b). Unlike conventional approaches, where the photomasking hole is not recessed at all, the depth of the photomasking hole recess 211 is typically similar to the depth of the zero marks recess 213, with a variation of up to 5–10%. The zero marks recess should be sufficiently deep to allow the zero marks to be detected in subsequent alignment steps. The depth of both the zero marks recess and the photomasking hole recess is preferably 20 to 2000 Å, more preferably 800 to 1200 Å.

Ion implantation is then performed over the photomasking hole 212 to form a deep P or N well 214, illustrated in FIG. 2(c). Finally, the photoresist layer 206 is stripped and the surface is cleaned, to form the structure in FIG. 2(d).

Because zero marks facilitate alignment of layers in semiconductor devices, they are typically formed first and are carried along during further structure formation. Consequently, subsequent processing steps leading to the formation of isolation regions should not remove the zero marks. Since the invention concerns the concurrent formation of a zero marks mask with a well implant mask, subsequent operations leading to the structures in FIGS. 2(c)–2(d) are optional. While still further processing steps are contemplated by the invention, processing can be terminated at any point after the formation of the zero marks/well implant mask.

The invention makes it possible to eliminate the separate zero-mask step, by forming the zero marks mask concurrently with the well implant mask. This reduces the total number of steps needed to form semiconductor devices.

The present invention contemplates the situation where the zero marks are located on the periphery of the semiconductor device, as well the situation where zero marks are located in one or more diode fields. While in FIGS. 2(a)–2(d) the zero marks are shown adjacent to the active regions on the substrate, it is understood that distances between features in these figures are not necessarily drawn to scale. Hence, the figures are intended to encompass arrangements where the zero marks are adjacent to the active regions, as well as arrangements where the zero marks are spatially removed from the active regions (e.g. where the active regions are located on the interior of the substrate surface and the zero marks are located on the periphery).

The individual processing steps for use in the present invention are well known to those of ordinary skill in the art, and are also described in Encyclopedia of Chemical Technology, Kirk-Othmer, Volume 14, pp. 677–709 (1995); Semiconductor Device Fundamentals, Robert F. Pierret, Addison-Wesley, 1996; and Microchip Fabrication $3^{rd}$ edition, Peter Van Zant, McGraw-Hill, 1997.

The dielectric layer may be deposited by conventional methods known to those of ordinary skill in the art, such as by spin-on methods, sintering (which may further include sol-gel oxide formation), chemical vapor deposition, etc. A glass layer deposited by a chemical vapor deposition technique may be subject to a glass reflow step (e.g., by heating) to smooth, densify and further improve the contact between the protection layer and the substrate.

Etching of deposited films may be conducted by conventional methods known to those of ordinary skill in the art. The specific etching methods and materials depend on the material being removed, the resist material and the compatibility of the etching material with the existing structure. Selection of suitable etching materials, resist materials and etching conditions is within the level of ordinary skill in the art.

The semiconductor structures of the present invention may be incorporated into a semiconductor device such as an integrated circuit, for example a memory cell such as an SRAM, a DRAM, an EPROM, an EEPROM etc.; a programmable logic device; a data communications device; a clock generation device; a nonvolatile memory device, etc. Furthermore, any of the semiconductor devices may be incorporated into an electronic device (e.g. a computer, an airplane, a mobile telephone, or an automobile).

The present invention contemplates the situation where the zero marks are located on the periphery of the semiconductor device, as well the situation where zero marks are located in one or more diode fields.

Obviously, numerous modifications and variations of the present invention are possible in light of the above teachings. It is therefore to be understood that within the scope of the appended claims, the invention may be practiced otherwise than as specifically described herein.

What is claimed is:

1. A method for making a semiconductor structure, comprising:
    patterning a photoresist layer to form concurrently both a zero marks pattern and a well implant mask pattern;
    wherein said photoresist layer is on a region of a substrate; and
    wherein ion implantation is performed to form a deep P or N well in said substrate; and
    etching through said dielectric layer and into said substrate to form a set of zero marks, a photomasking hole, a zero marks recess, and a photomasking hole recess.

2. The method of claim 1, further comprising, prior to said patterning:
    forming a dielectric layer on said region of said substrate; and
    applying said photoresist layer onto said dielectric layer.

3. The method of claim 1, further comprising stripping said photoresist layer.

4. The method of claim 1, wherein said dielectric layer comprises oxide.

5. The method of claim 4, wherein said oxide layer has a thickness of 10-999 Å.

6. The method of claim 1, wherein the depth of said zero marks recess is 20-2000Å.

7. The method of claim 1, wherein the depth of said photomasking hole recess is similar to the depth of said zero marks recess, with a variation of up to 10%.

8. The method of claim 7, wherein said oxide layer comprises $SiO_2$ or $Al_2O_3$.

9. A method of making a semiconductor device, comprising:
    making a semiconductor structure by the method of claim 1; and
    forming a semiconductor device from said semiconductor structure.

10. The method of claim 9, wherein said zero marks are located on the periphery of said semiconductor device.

11. The method of claim 9, wherein said zero marks are located in one or more diode fields of said semiconductor device.

12. A method of making an electronic device, comprising:
    making a semiconductor device by the method of claim 9; and
    forming an electronic device comprising said semiconductor device.

* * * * *